May 14, 1974 R. R. TROUTMAN 3,810,795

METHOD FOR MAKING SELF-ALIGNING STRUCTURE FOR CHARGE-COUPLED AND BUCKET BRIGADE DEVICES

Filed June 30, 1972

United States Patent Office 3,810,795
Patented May 14, 1974

3,810,795
METHOD FOR MAKING SELF-ALIGNING STRUCTURE FOR CHARGE-COUPLED AND BUCKET BRIGADE DEVICES

Ronald Roy Troutman, Essex Junction, Vt., assignor to International Business Machines Corporation, Armonk, N.Y.

Filed June 30, 1972, Ser. No. 267,860
Int. Cl. H01l 7/34
U.S. Cl. 148—187 12 Claims

ABSTRACT OF THE DISCLOSURE

Interconnected, but self-isolating conductive lines on different levels are achieved on monolithic integrated semiconductor devices. Layers of insulating semiconductor material are separated in selected areas by deposits of a dielectric diffusion barrier material and dopants to render the layers conductive are diffused therein. The deposits of the buried barrier material act as a diffusion mask as to prevent the diffused dopants from penetrating into selected areas of the underlying semiconductor body to leave in the underlying semiconductive layer a non-conductive region. This causes portions of the layers of insulating material to be rendered conductive, while still maintaining their insulating characteristics in selected regions, thereby electrically separating the layers one from another in selected areas. Critical alignments between masks and subsequent diffusions are avoided. The method of the invention may be used to create all types of semiconductor devices, especially Field Effect Transistors and charge-coupled devices either separately or simultaneously on the same body.

RELATED APPLICATIONS

Application Ser. No. 95,225 filed on Dec. 4, 1970 by J. J. Chang and J. W. Sumilas and assigned to the same assignee as the present invention teaches that junctionless charge-coupled semiconductor devices can be operated with but two-voltage signals when the semiconductor body has an electrode array arranged on a contoured, insulating layer on a surface of the body.

Application Ser. No. 129,096 filed on Mar. 29, 1971 by B. Agusta et al. and assigned to the same assignee as the present invention, now abandoned, teaches the advantages of a zero-gap two-phase charge-coupled semiconductor body and a specific method of making such a device.

BACKGROUND OF THE INVENTION

(1) Field of the invention

This invention relates generally to semiconductor devices and more particularly to the formation of conductive patterns on the surface of semiconductor bodies.

(2) Description of the prior art

Semiconductor devices without fixed P–N junctions therein which utilize the property of the semiconductor material itself, together with appropriate electrodes on the surface of the device to transport charges through the body have been discussed in the literature and are known as charge-coupled devices.

U.S. Pat. 3,475,234 discloses a method of making field effect transistor devices by using multiple dielectric layers and a self-limiting etch technique based on the use of a differential etchant so that the proper location of the gate electrode with respect to the source and drain junctions of the FET so produced is insured. This is accomplished in particular by using a silicon gate electrode as the diffusion mask defining both the source and drain regions which silicon gate is diffused with the same impurities and to the same concentration as the source and drain regions.

U.S. Pat. 3,460,007 teaches a semiconductor junction device wherein a solid diffusion source is not only left on the surface of the semiconductor body as a protective cover over the device junction, but it is also utilized as an electrical contact to the diffused portion of the body immediately adjacent to the diffusion source. This is accomplished by depositing a first layer of polycrystalline semiconductor material on a monocrystalline semiconductor body which polycrystalline layer contains a diffusant which is diffused therefrom into the body to convert a portion of the underlying body into the opposite type conductivity. When a layer of high resistivity material is deposited on the first polycrystalline layer, a second layer of polycrystalline semiconductor material can be deposited over the high resistivity material thus serving as an electrical connection to the diffused portion.

U.S. Pat. 3,577,036 is typical of the prior art which teaches that metallic layers may be evaporated unto semiconductor devices and that these layers may be isolated from one another or connected together.

SUMMARY OF THE INVENTION

It is an object of the invention to provide an improved semiconductor device having adjacent layers on the surface thereof which can be selectively connected together and doped to render portions of them conductive, while maintaining other portions non-conductive thereby achieving isolation between the conductive portions.

It is another object of the invention to provide a method of making a semiconductor device having interconnected conductive patterns on the surface thereof which are self-isolating.

It is a further object of the invention to provide a method of creating a semiconductor charge-coupled array.

It is still a further object of the invention to provide an improved self-aligned Field Effect Transistor which has connections to the diffused source and drain formed at the same time and by the same process that forms the source and drain.

It is a further object of the invention to provide a high density charge-coupled array which has during operation substantially zero spacing between created depletion regions thus improving the efficiency of the array.

It is still another object of the present invention to describe a process for producing this improved FET and this improved charge-coupled semiconductor array which process is not only simple but will result in a superior product.

More particulary, the present invention teaches that a self-aligned field effect transistor and a charge-coupled array can be provided in a single semiconductor body. This is accomplished by utilizing a series of steps to provide in the body source and drain regions while simultaneously creating on the surface of the body interconnectable conductive patterns which serve as phase lines for the charge-coupled array.

In greater detail the process for producing the present invention comprises the growing of a thin insulating layer such as silicon dioxide on the surface of a semi-conductor body. Over this first layer there is deposited a relatively thick layer of an insulating material such as semiconductor. When a semiconductor is used, it may be polysilicon which is either intrinsic; that is, not containing conductive dopants, or doped. This insulating layer is in turn coated with a deposit of a dielectric diffusion barrier material such as silicon nitride. This silicon nitride layer not only serves as a mask for both selectively etching the underlying polysilicon layer but also serves as a diffusion mask. The layer of silicon nitride is then etched into a selective pattern and a second layer of insulating material such as polysilicon, either intrinsic or doped opposite to that of the first layer, is deposited over the entire surface of the body. Both layers of polysilicon are then etched, following which any exposed portions of the silicon nitride layer exposed by a possible mask shift is also etched. A diffusion is then made into the polysilicon layers to cause both the first and second layers where they are exposed to the diffusion to become doped to the same level and with the same conductivity type. However, the regions of the first polysilicon layer underlying the silicon nitride are not affected by this diffusion because of the barrier action of the silicon nitride. Thus when the layers are insulating any region under the silicon nitride remains insulating or non-conductive and when the first deposited layer is doped. In this manner isolation packets in the first polysilicon layer itself between conductive portions are realized. The diffusion which creates the conductive portions in the polysilicon layers can also be used to create at the same time the source and drain regions of an FET so that a self-aligned, interconnected FET device can be produced at the same time the conductive lines are produced.

DESCRIPTION OF THE DRAWING

The present invention can be best understood by studying the following specification in conjunction with the drawing wherein.

DESCRIPTION OF THE PREFERRED EMBODIMENT

Figure 1:
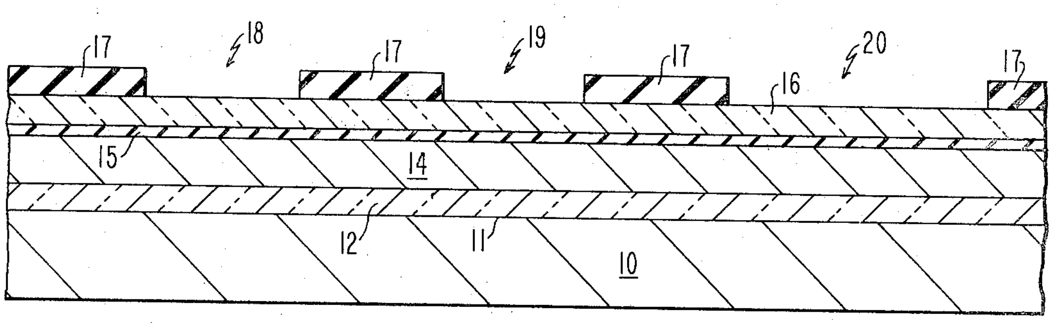
FIGS. 1 to 4 illustrate the steps necessary for the simultaneous creation of an FET and a charge-coupled device in a single unitary body of semiconductor material.

Referring now to the drawings, a semiconductor device composed of a self-aligned FET device and charge-coupled device will be described in detail as to its fabrication and operation. The operation of FET devices and of charge-coupled devices is now known and taught in the prior art.

Illustrated in FIGS. 1 through 4 is a monocrystalline body of semiconductor material 10; such as, P-type silicon, preferably having a resistivity of about 1 to 2 ohm-centimeters. Although for the purposes of describing this invention reference will be made to a P-type semiconductor body, it should be understood that the opposite type conductivity material may also be utilized. Following cleaning of the uppermost surface 11 of the body, by conventional techniques, a layer 12 of silicon dioxide, 1000 to 2000 Angstrom in thickness, is formed thereon. This layer 12 can be produced by a chemical vapor deposition process by heating the semiconductor body to between 1100° C. and 1200° C. in a hydrogen atmosphere containing a small amount of oxygen for about 30 minutes.

Following the establishment of the silicon dioxide layer 12, a layer of polycrystalline silicone 5,000 to 10,000 Angstroms in thickness is pyrolytically deposited on the top of the silicon dioxide layer 12. This polysilicon layer is formed by the known technique of epitaxial growth caused by placing the unit 10 in a chamber heated to about 900° C. in the presence of a decomposed silane gas contained in a hydrogen stream. When an epitaxial silicon layer is thus grown on an oxide or nitride layer, the layer so grown will be polycrystalline. Over this polycrystalline layer 14 there is now deposited a layer of silicon nitride 15. This nitride layer is approximately 600 Angstroms thick and is grown by mixing silane and ammonia gas in a carrier gas stream of hydrogen and introducing this gas mixture into a chamber containing the silicon body at the temperature of about 900° C. At this temperature a reaction occurs involving a decomposition of the silane which results in the formation of the layer 15 deposited on the polycrystalline silicon layer 14.

If the initial silicon dioxide layer 12 is decreased much below 1000 Angstroms in thickness, it is necessary to add an intermediate layer of silicon nitride (not shown) between the silicon dioxide layer 12 and the polycrystalline layer 14 in order to provide an adequate diffusion barrier when the gate of an FET device is diffused. However, since the present process will be described using a thicker oxide layer 12, this nitride layer has been omitted from this description of the process. It should be noted, however, that the inclusion of such a nitride layer will require an additional etching step and should be obvious to those skilled in the art. However, no additional mask would be needed since the silicon and nitride layers can act as masks for subsequent processing of this layer.

After the formation of the silicon nitride layer 15 a 3000 thick Angstrom layer of silicon dioxide 16 is formed over it. This layer 16 not only assures a base for the adhesion of any subsequent photoresist layers which do not adhere well to silicon nitride but can also be used to isolate adjacent devices. Preferably, this layer of silicon dioxide is formed by pyrolytic deposition at about 800° C.

Figure 2:
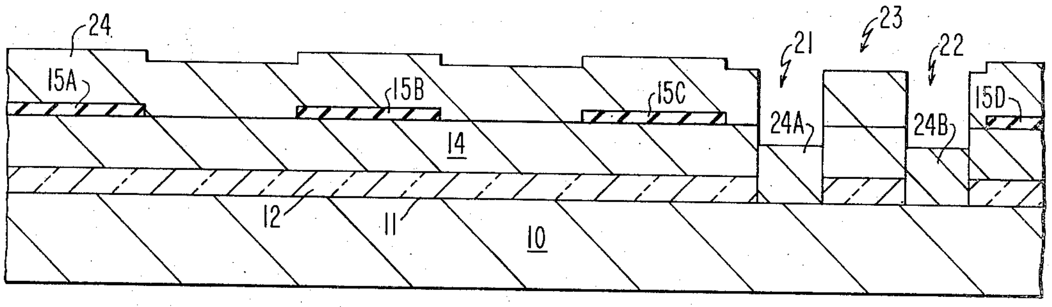

Once all these various layers of selected material have been deposited on the surface of the semiconductor body 10 in the required thicknesses are set forth, a photoresist layer 17 is provided over the entire surface and exposed in accordance with well known techniques to permit the opening of windows 18, 19 and 20 in the photoresist layer 17. In windows 18 and 19 there will be created phase lines for a charge-coupled array and in window 20 there will be created an FET device. These windows, in turn, are used to etch through the underlying silicon dioxide layer 16 and to etch the silicon nitride layer 15 into a series of islands 15A, 15B, 15C and 15D as shown in FIG. 2.

These islands 15A through 15D are formed by removing the layers 15 and 16 exposed through the windows 18, 19 and 20. This removal of these layers is accomplished by using different etchant for each of the different materials. For example, the outermost layer of silicon dioxide layer 16 is removed by dipping the photoresist coating in a solution of buffered hydrofluoric acid. This acid solution removes the unmasked portions of layer 16 underlying the windows 18, 19 and 20. However, since the hydrofluoric acid solution does not substantially attack silicon nitride the underlying silicon nitride layer 15 would be substantially unaffected. Thus the etching treatment using the hydroflouric solution effectively is terminated upon reaching the silicon nitride layer 15. Layer 15 is in turn removed by using a hot phosphoric acid solution which attacks only that portion of layer 15 which has been exposed by removal of the silicon dioxide layer 16 underlying the windows 18, 19 and 20. This hot phosphoric solution will simultaneously attack and dissolve the photoresist layer 17. However, since the photoresist layer 17 is no longer effective as an etching mask it does not matter whether the layer 17 remains on the surface of the silicon dioxide layer 16 or not. The silicon dioxide layer 16 itself now the primary barrier to the etching action of the hot phosphoric solution; that is, the hot phosphoric solution will attack the silicon nitride 15 only where it is exposed by the previously etched away, in the area of windows 18, 19 and 20, silicon dioxide layer 16.

Once the layer 15 has been etched into the desired pattern, shown as islands 15A through 15D, the remaining elements of layer 16 in the region of the charge-coupled device and the FET device are removed by a suitable masking and etching technique such as described above.

When more than one charge-coupled array or FET device is being produced on a single semiconductor wafer, a portion of this pyrolytic layer 16 would be left on the surface of the wafer to provide isolation between a dopant channel or FET devices. The masking to remove the excess portions of layer 16 is also utilized in the region of window 20, to create a source opening 21 and a drain opening 22. These openings are separated by gate element 23 and extend from the surface of the exposed polysilicon layer 14 through layer 12 to the surface of the body 10. Once the source and drain openings 21 and 22 are provided in region of the window 20, a second polycrystalline silicon layer 24, 5,000 to 10,000 Angstroms in thickness, is pyrolitically deposited over the entire surface of the device. This polysilicon layer 24 not only covers the islands 15A through 15D, but also is deposited in the source opening 21 as a plug 24A and in the drain opening 22 as a plug 24B.

Figure 3:
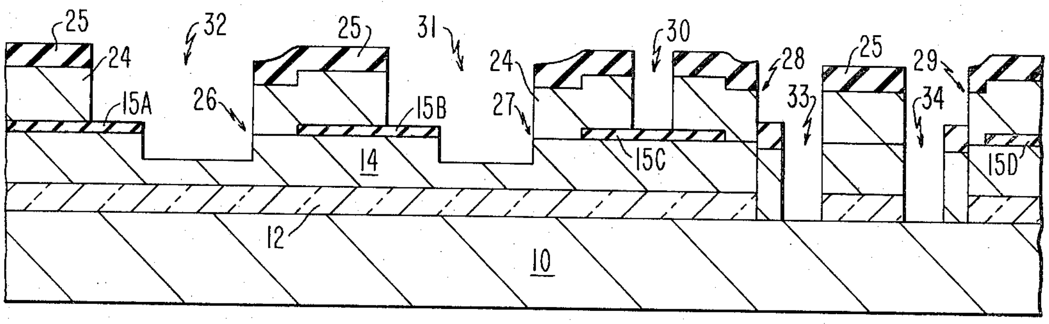

Following the deposition of the polysilicon layer 24, it is masked, for example, by a photoresist material 25, shown in FIG. 3, to permit selective etching of the polysilicon layers 24 and 14 and plugs 24A and 24B to provide openings 30, 31, 32, 33 and 34 in layer 24 and plugs 24A and 24B. It is to be noted that in FIG. 3 the mask 25 is aligned with respect to the silicon nitride islands 15A through 15D to leave connecting posts 26, 27, 28 and 29 between the first polysilicon layer 14 and the second polysilicon layer 24. The opening 30 is provided to separate and isolate the charge-coupled array from the FET device. It is to be noted that in this etching step the exposed portions of the second polysilicon layer 24 are etched entirely away. This etching step also exposes a portion of the silicon nitride islands 15A and 15B. These exposed portions of islands are not etched by the etchant used for the polysilicon and act as etchant masks for the first polysilicon layer 14. So that while the second polysilicon layer 24 is etched through completely where exposed the first underlying polysilicon layer 14 is etched only where it is exposed. Once layer 24 is etched through this etching step can be terminated. However, it is usually continued for a brief period to assure the plugs 24A and 24B are etched through. Thus exposed portions of layer 14 are etched as shown in FIG. 3. Such etching control is well known in the art and when performed at a low temperature very accurate control is assured.

Once the openings 30, 31, 32, 33 and 34 are made through the polysilicon layer 24, the exposed portions of the islands 15A and 15B are removed by use of a selective etching process as described above. In this case the polysilicon layer 24 overlying the islands acts as a mask to permit etching of the islands only where they are exposed by the removal of the layer 24.

Figure 4:
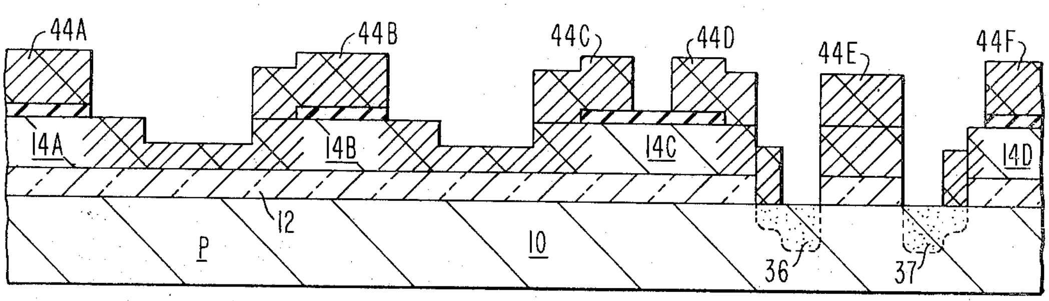

A diffusion is now performed to create the finished device as shown in FIG. 4. The material being diffused in this case would be phosphorous or arsenic or other N-type impurity. The selected material is diffused or ion implanted into the entire surface of the device shown in FIG. 4. Enough of the selected dopant material is used to cause those portions of polycrystalline layers 24 and 14 which it penetrates to become conductive. The impurity concentration in these layers 14 and 24 and in the exposed source and drain regions is, preferably, between $10^{17}$ and $10^{19}$ impurity atoms per cubic centimeter. The dopant penetrates into the exposed polycrystalline layers 24 and 14. It penetrates layer 24 until it reaches the buried silicon nitride islands 15A through 15D at which time the penetration of the impurity atoms is stopped by the nitride which acts as a barrier to the diffusion of the impurity atoms. Thus it does not dope those portions of polycrystalline layer 14 underlying the silicon nitride islands 15A through 15D. The silicon dioxide layer 12 which also acts as a diffusion barrier preventing doping of the body 10. However, because the surface 11 of the body 10 is exposed by the source and drain openings 33 and 34 through plugs 24A and 24B, the impurities readily penetrate into the body 10 in this area to form source and drain regions 36 and 37. The impurities also dope the plugs 24A and 24B in the source drain region to cause those plugs to also become conductive. As shown in FIG. 4, because no oxide layer 12 remains under the plugs 24A and 24B a slight penetration of the dopants into the body under the plugs 24A and 24B also occurs. In this manner the plugs 24A and 24B now serve as intimate connections to the underlying diffused source and drain regions 36 and 37 in the silicon body 10.

Because the islands 15A, 15B, 15C and 15D act as barriers to the diffusions, it should be noted that immediately under the barriers there exists undiffused regions 14A, 14B, 14C and 14D which together with the islands 15A through 15D each serve to insulate each diffused segment of the polycrystalline layers one from the other. These diffused segments are now for clarity, labeled 44A, 44B, 44C, 44D, 44E and 44F. Segments 44A, 44B and 44C are, in FIG. 4, used as phase lines for a charge-coupled semiconductor device. It is to be noted that these segments 44A, 44B and 44C are insulated one from the other by the undiffused regions 14A, 14B and 14C even though there is no lateral separation between them. Actually, there is a slight overlap between the phase lines, because of a slight lateral diffusion in the polysilicon layer 14 under the nitride islands. However, the nitride islands 15A, 15B, 15C and 15D are of sufficient width to assure that this diffusion is insufficient to extend across the entire width. Thus the diffused polycrystalline layers 24 and 14 where they serve as phase lines are interconnected by the diffused silicon posts 26 and 27 and are insulated one from the other by the undiffused regions 14A, 14B and 14C existing in layer 14 under the silicon nitride islands. It is to be noted that the posts 28 and 29 provide a ready connection to the source and drain regions 36 and 37, respectively, of the FET produced in this manner.

In addition to the structural details of the invention as set forth above similar remarks are in order concerning the charge transfer operation and its insensitivity to mask alignment. If we consider, for example, the isolation area 14B, as determining the width of the potential barrier between the storage locations, we see that this width is not critical so long as it is wide enough to provide isolation between the fringe fields from the adjacent phase line. Because the value of this isolation is not particularly critical, the structure is compeltely self-aligning.

The process thus provides for an extremely small cell area than can be obtained by previously known processes.

After the unit is made as described above, and the diffusion is complete, a pyrolitic oxide layer can be deposited over the unit to completely seal off the device from any subsequent contamination that may occur during handling of the device. When electrical connections are thus made to the diffused areas, we have in one single semiconductor body both an FET and a charge-coupled device. The process thus described permits the making of either a charge-coupled device or an FET device either alone or in combination.

The operation of FET devices is well known to the semiconductor art as is also the utilization of such charge channel arrays, especially when they are used as shift registers.

The described, however, has the unique arrangement in that the polycrystalline layer which acts to isolate the charge-coupled device from the adjacent phase lines is the same material which is used to provide the electrical fields necessary for the charge-coupled operation under the phase lines.

It should be understood that although the invention has been described using particular resistivities and conductivities for the materials and using silicon nitride as a barrier diffusion material that other suitable materials can be substantial or utilized.

While the invention has been particularly shown and described with reference to the preferred embodiment thereof, it will be understood by those skilled in the art that various changes in forms and details of the apparatus and the method of processing to produce this apparatus may be made therein without departing from the spirit and scope of the invention and that the method is in no way restricted by the apparatus.

What is claimed is:

1. A method of forming conductive, isolated lines in multiple interconnected layers comprising the steps of:
depositing a first layer of insulating material on a semicondutcor body,
forming a patterned layer of dielectric barrier material on said first layer,
covering the patterned barrier material and portions of the first insulating layer with a deposit of a second insulating layer; and
treating said body to render said second layer and those portions of said first layer uncovered by the patterned barrier material conductive while leaving the portions of said first material covered by said patterned barrier material insulating.

2. The method of claim 1 wherein there is provided the steps of depositing a dielectric material on the surface of said body before said first insulating layer is deposited.

3. The method of claim 1 wherein said first and said second insulating layers are composed of the same material.

4. The method of claim 1 wherein said second layer is rendered conductive while it is being deposited.

5. The method of claim 1 wherein said first and second layers are a semiconducting material.

6. The method of claim 1 wherein said first and second layers are polysilicon.

7. The method of claim 1 wherein said dielectric barrier material is silicon nitride.

8. The method of claim 1 wherein said first and second layers as deposited each have a resistivity greater than 10 ohm-centimeters.

9. The method of claim 2 wherein said dielectric material is silicon dioxide.

10. The method of claim 1 wherein said first layer as deposited has a resistivity greater than 10 ohm-centimeters and said second layer has a resistivity less than 10 ohm-centimeters.

11. The method of claim 2 where there is further provided the step of removing a portion of said insulating layer and said dielectric material to expose the surface of said body.

12. A method of forming conductive, connected, multiple layers which are self-isolating comprising the steps of:
depositing a first layer of polysilicon on the surface of a semiconductor body coated with a layer of silicon dioxide,
covering the first polysilicon layer with dielectric barrier material,
forming a pattern in the layer of barrier material,
covering the patterned barrier material with a second layer of polysilicon,
forming a pattern in the second layer of polysilicon to expose a portion of the underlying pattern barrier material,
removing the exposed barrier material;
diffusing selected materials into said polysilicon layers to render said second polysilicon layers and those portions of said first polysilicon layer undercovered by said barrier material conductive,
the barrier material layer acting as a diffusion mask to prevent the diffused materials from penetrating into the portion of the first polysilicon layer underlying the barrier material.

References Cited

UNITED STATES PATENTS

| | | | |
|---|---|---|---|
| 3,514,845 | 6/1970 | Legat et al. | 317—235 X |
| 3,699,646 | 10/1972 | Vadasz | 148—187 X |

OTHER REFERENCES

Chou et al. "Variable Threshold Field-Effect Transistor," IBM Tech. Disul. Bull., vol. 13, No. 6, November 1970, p. 1485.

L. DEWAYNE RUTLEDGE, Primary Examiner

J. M. DAVIS, Assistant Examiner

U.S. Cl. X.R.

148—188; 317—235